United States Patent
Nozaki et al.

(10) Patent No.: US 7,145,122 B2
(45) Date of Patent: Dec. 5, 2006

(54) IMAGING SENSOR USING ASYMMETRIC TRANSFER TRANSISTOR

(75) Inventors: Hidetoshi Nozaki, San Jose, CA (US); Sohei Manabe, San Jose, CA (US)

(73) Assignee: OmniVision Technologies, Inc., Sunnyvale, CA (US)

(*) Notice: Subject to any disclaimer, the term of this patent is extended or adjusted under 35 U.S.C. 154(b) by 101 days.

(21) Appl. No.: 10/867,020

(22) Filed: Jun. 14, 2004

(65) Prior Publication Data
US 2005/0274874 A1   Dec. 15, 2005

(51) Int. Cl.
  *H01L 27/00* (2006.01)
(52) U.S. Cl. .............. 250/208.1; 250/214 R; 250/214.1
(58) Field of Classification Search .......... 250/208.1, 250/214 R, 214.1
  See application file for complete search history.

(56) References Cited

U.S. PATENT DOCUMENTS 5,340,766 A * 8/1994 Nakashiba ............... 438/60
6,617,625 B1 * 9/2003 Miyagawa ............... 257/290
2001/0054713 A1 12/2001 Miyagawa
2003/0127666 A1  7/2003 Lee

FOREIGN PATENT DOCUMENTS

| JP | 62-296463 | 12/1987 |
| JP | 09326482 | 12/1997 |
| JP | 2003234496 | 8/2003 |

OTHER PUBLICATIONS

European Search Report App. No. EP 05 25 1953; OmniVision Technologies, Inc.; dated Sep. 28, 2005; 2 pages.

* cited by examiner

*Primary Examiner*—Que T. Le
(74) *Attorney, Agent, or Firm*—Perkins Coie LLP

(57) ABSTRACT

The present disclosure introduces a simple method for reducing the capacitance of the floating diffusion node of a CMOS image sensor and consequently improving the image sensor's sensitivity. While reducing parasitic capacitances such as the capacitance between the transfer gate and the floating node, the proposed device layouts, in which the channel width of the detection section is different from the channel width of the photoelectric conversion element, demand no more than what is required for the fabrication of the traditional layouts.

30 Claims, 8 Drawing Sheets

IMAGING SENSOR USING ASYMMETRIC TRANSFER TRANSISTOR

TECHNICAL FIELD

The present invention relates to the field of solid state imaging devices and, in particular, to CMOS image sensors.

BACKGROUND

CMOS imaging devices were first developed between the early and late 1970s; however, because of their unacceptable performance they were generally overlooked until the early 1990s when advances in CMOS design yielded chips with smaller pixel sizes, reduced noise, more capable image processing algorithms, and larger imaging arrays. Among the major advantages of CMOS sensors are their low power consumption, master clock, and single-voltage power supply. This is in contrast with charge-coupled devices (CCDs) that often require five or more supply voltages at different clock speeds with significantly higher power consumption.

Both CMOS and CCD imaging devices sense light through the photoelectric effect, which occurs when photons interact with crystallized silicon to promote electrons from the valence band into the conduction band. Typically, a photodiode is used as the light sensing element of a pixel. A major advantage that CMOS image sensors enjoy over their CCD counterparts is the ability to integrate directly onto a sensor integrated circuit a number of processing and control functions that lie beyond the primary task of photon collection.

A pixel is the key element of a digital image sensor. The pixel includes various amplification devices, readout devices, and a light sensing device, such as a photodiode. When a broad wavelength band of visible light is incident on specially doped silicon semiconductor materials, a variable number of electrons are released in proportion to the photon flux density incident on the surface of the photodiode. Electrons are collected in a potential well until the integration (illumination) period is finished, and then they are either converted into a voltage or current (CMOS processors) or transferred to a metering register (CCD sensors).

Sensitivity is determined by a combination of the maximum charge that can be accumulated by the photodiode coupled to the conversion efficiency of incident photons to electrons and the ability of the device to accumulate the charge in a confined region without leakage or spillover. These factors are typically determined by the physical size and aperture of the pixel, and its spatial and electronic relationship to neighboring elements in the array. Pixels are typically organized in an orthogonal grid. The signals from all of the pixels composing each row and each column of the array must be accurately detected and measured (read out) in order to assemble an image from the photodiode charge accumulation data.

The most popular CMOS designs are built around active pixel sensor (APS) technology in which both the photodiode and readout amplifier are incorporated into each pixel. This technology enables the charge accumulated by the photodiode to be converted into an amplified voltage inside the pixel and then transferred in sequential rows and columns to the analog signal-processing portion of the chip. Thus, each pixel (or imaging element) contains, in addition to a photodiode, a number of transistors that converts accumulated electron charge into a measurable voltage, resets the photodiode, and transfers the voltage to a vertical column bus.

One of the important advantages of CMOS image sensors is that digital logic circuits, clock drivers, counters, and analog-to-digital converters can be placed on the same silicon substrate and at the same time as the pixel array. However, in order to guarantee low-noise devices with high performance, the standard CMOS fabrication process must often be modified to specifically accommodate image sensors. For example, standard CMOS techniques for creating transistor junctions in logic chips might produce high dark currents and low blue response when applied to an imaging device. Optimizing the process for image sensors often involves tradeoffs that render the fabrication scenario unreliable for common CMOS devices.

BRIEF DESCRIPTION OF THE DRAWINGS

The foregoing aspects and many of the attendant advantages of the invention will become more readily appreciated as the same become better understood by reference to the following detailed description, when taken in conjunction with the accompanying drawings, wherein.

DETAILED DESCRIPTION

Embodiments of a method for reducing the capacitance of the floating diffusion node of a CMOS image sensor and consequently improving the image sensor's sensitivity are described in detail herein. The proposed device layouts and associated fabrications, while reducing parasitic capacitance such as the capacitance between the transfer gate and the floating node, demand no more than what is required for the fabrication of the traditional layouts.

In the following description, some specific details, such as example values for the circuit components, are presented to provide a thorough understanding of embodiments of the invention. One skilled in the relevant art will recognize, however, that the invention can be practiced without one or more of the specific details or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the uses of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
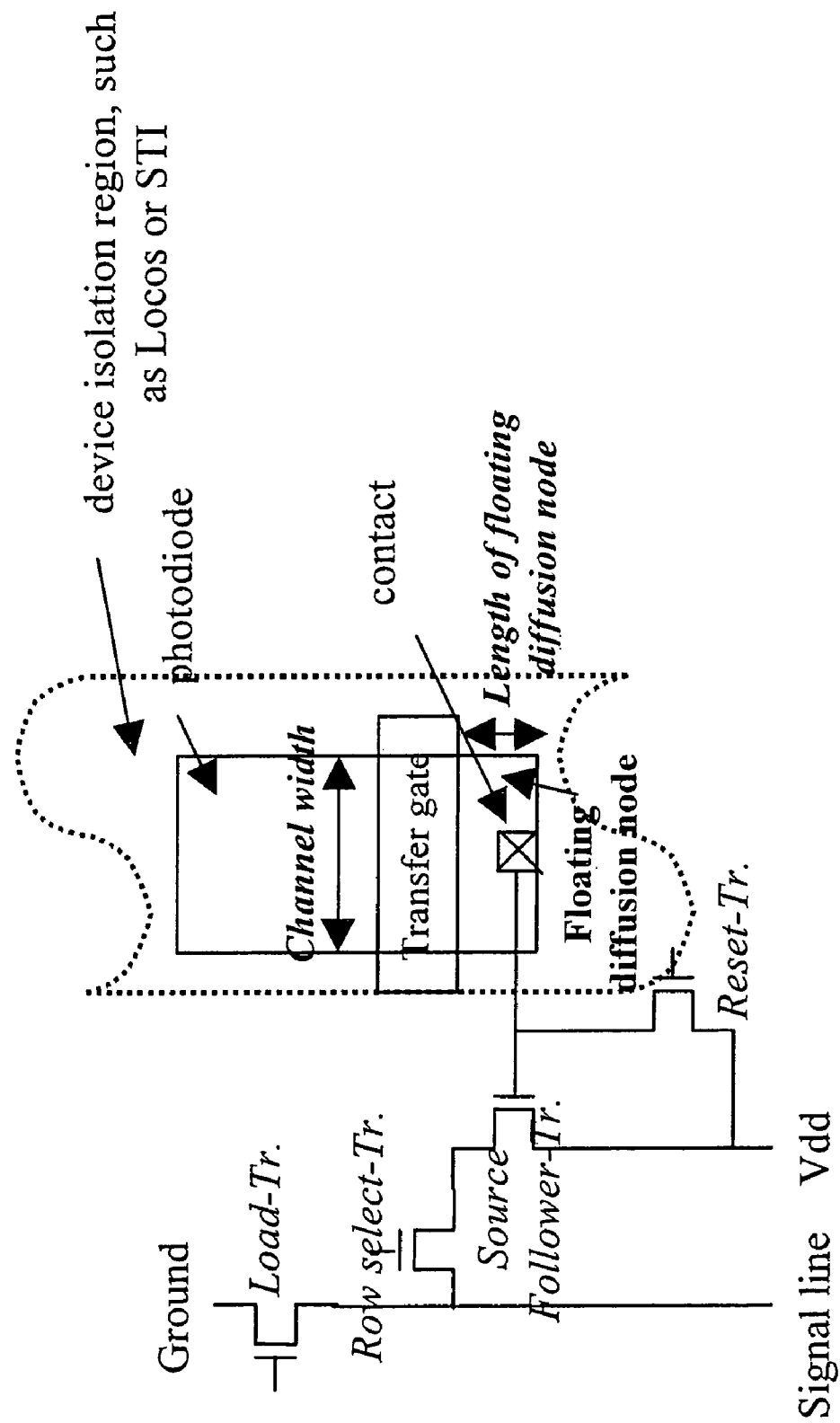
FIG. 1 is a schematic diagram of the device layout of a pixel and its supporting circuitry in accordance with the prior art.

FIG. 1 is a schematic diagram of the device layout of a pixel and its supporting circuitry in accordance with the prior art. The supporting circuitry allows for selecting a single pixel within a two-dimensional array of pixels, reading its content, and subsequently clearing it. The pixel also has a device isolation region, a photodiode that is an n- or p-channel that forms a signal accumulation region, a transfer gate, and an n- or p-type floating diffusion node.

Figure 2:
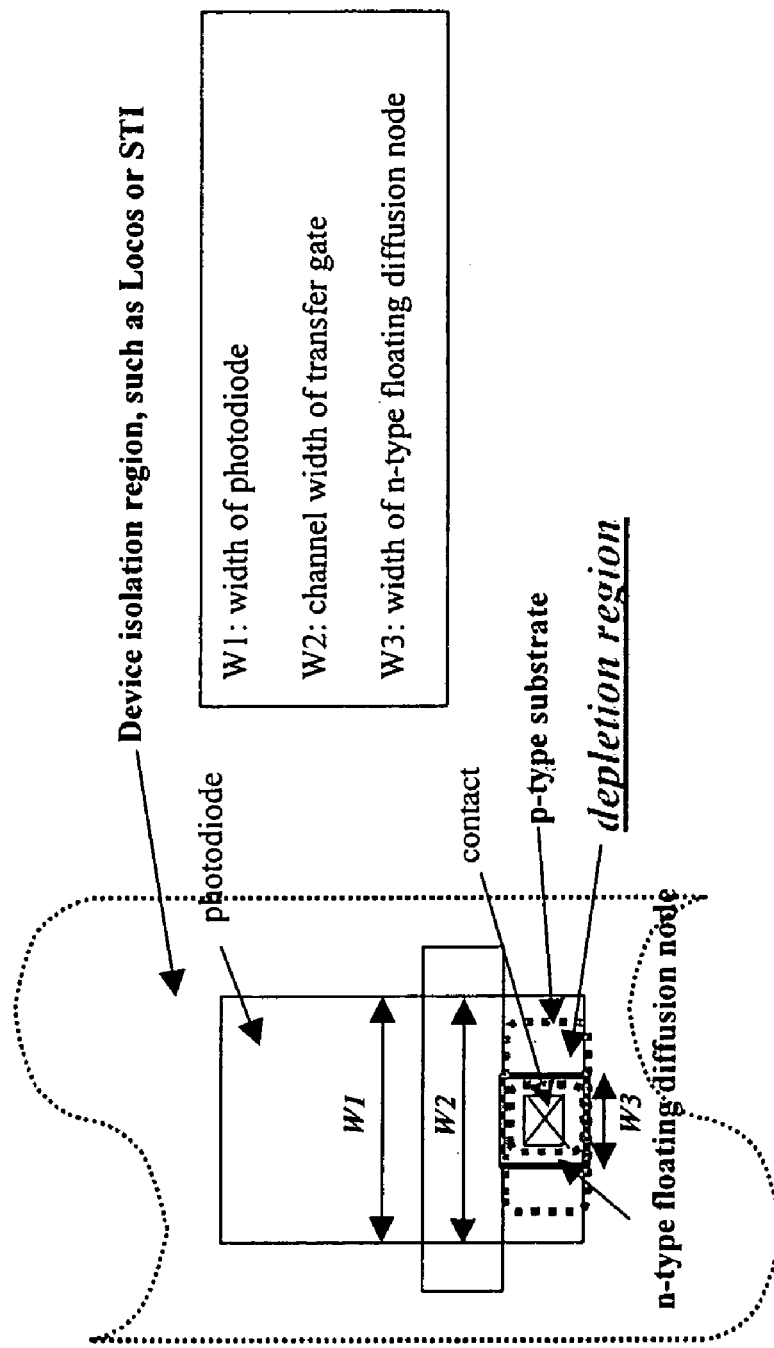
FIG. 2 is a schematic diagram of a more detailed device layout of a pixel in accordance with the prior art.

FIG. 2, which is a schematic diagram of a more detailed device layout of a portion of the pixel in accordance with the prior art, demonstrates that this structure has widely spread depletion regions on both sides of the floating diffusion node. These widely spread depletion regions, coupled with the transfer gate, will create large parasitic capacitance for the floating diffusion node, causing considerable performance degradation.

There are two main methods of decreasing the capacitance of the floating diffusion node in the prior art. One method is to decrease the channel width of the transfer gate and the other is to decrease the length of the floating diffusion node. However, when the channel width of the transfer gate is decreased, the readout path of the signal electrons that are transferred from the photodiode to the floating diffusion node becomes narrower and the signal charge transfer rate is disturbed. This causes image lag, low signal saturation level, and low sensitivity. Also, when the length of the floating diffusion node is decreased, the dispersion in the capacitances of the individual floating diffusion nodes becomes too large to be ignored and causes nonuniformity in sensitivity. Consequently, it is difficult to effectively decrease the capacitance of the floating diffusion node without incurring image lag, low signal saturation level, low sensitivity, and sensitivity nonuniformity.

Figure 3:
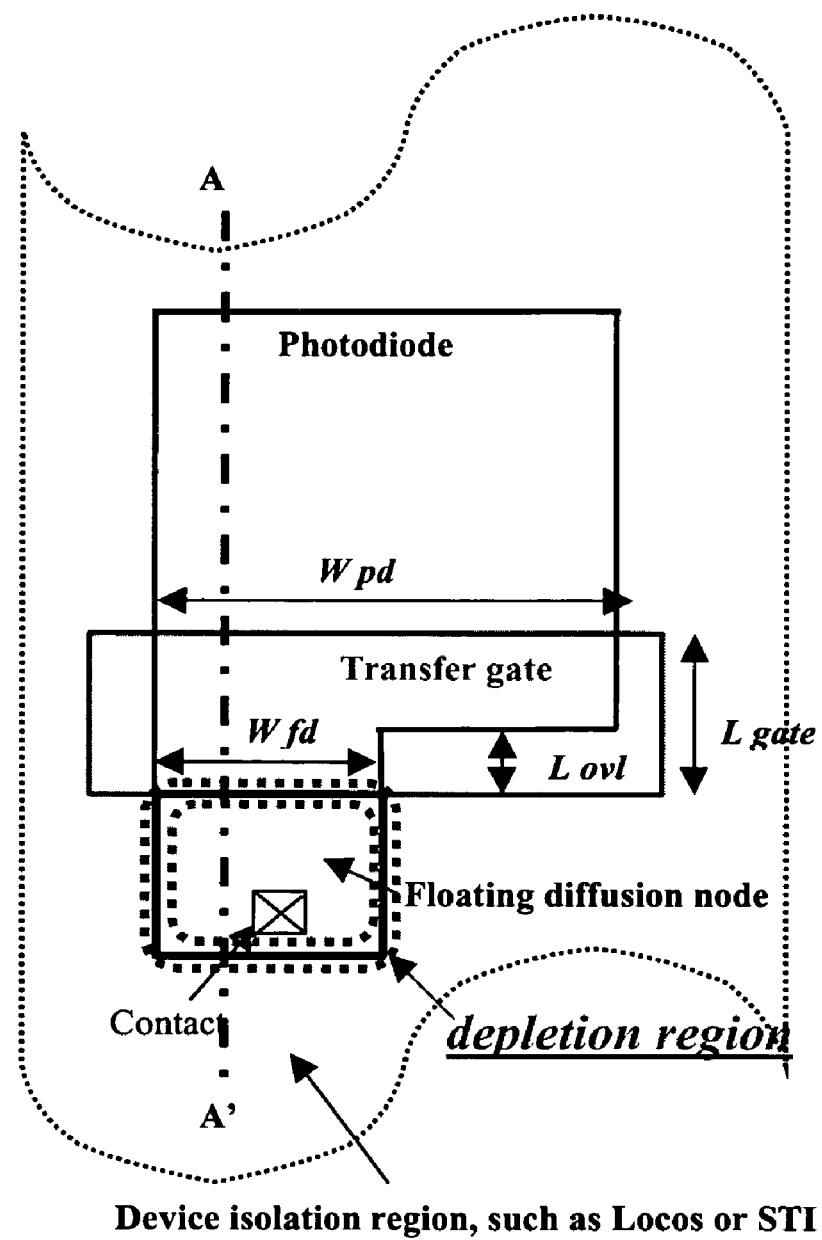
FIG. 3 is a schematic diagram of the device layout of a pixel in accordance with an embodiment of the present invention.

FIG. 3 is a schematic diagram of the device layout of a portion of a pixel in accordance with an embodiment of the present invention. In FIG. 3 the floating diffusion node area consists of device isolation regions such as Locos or STI. Furthermore, the transfer transistor comprising a photodiode as a source, a transfer gate, and a floating diffusion node as a drain is asymmetric. In this embodiment, the channel width $W_{fd}$ on the side of the floating diffusion node is less than the channel width $W_{pd}$ on the side of the photodiode.

Figure 4:
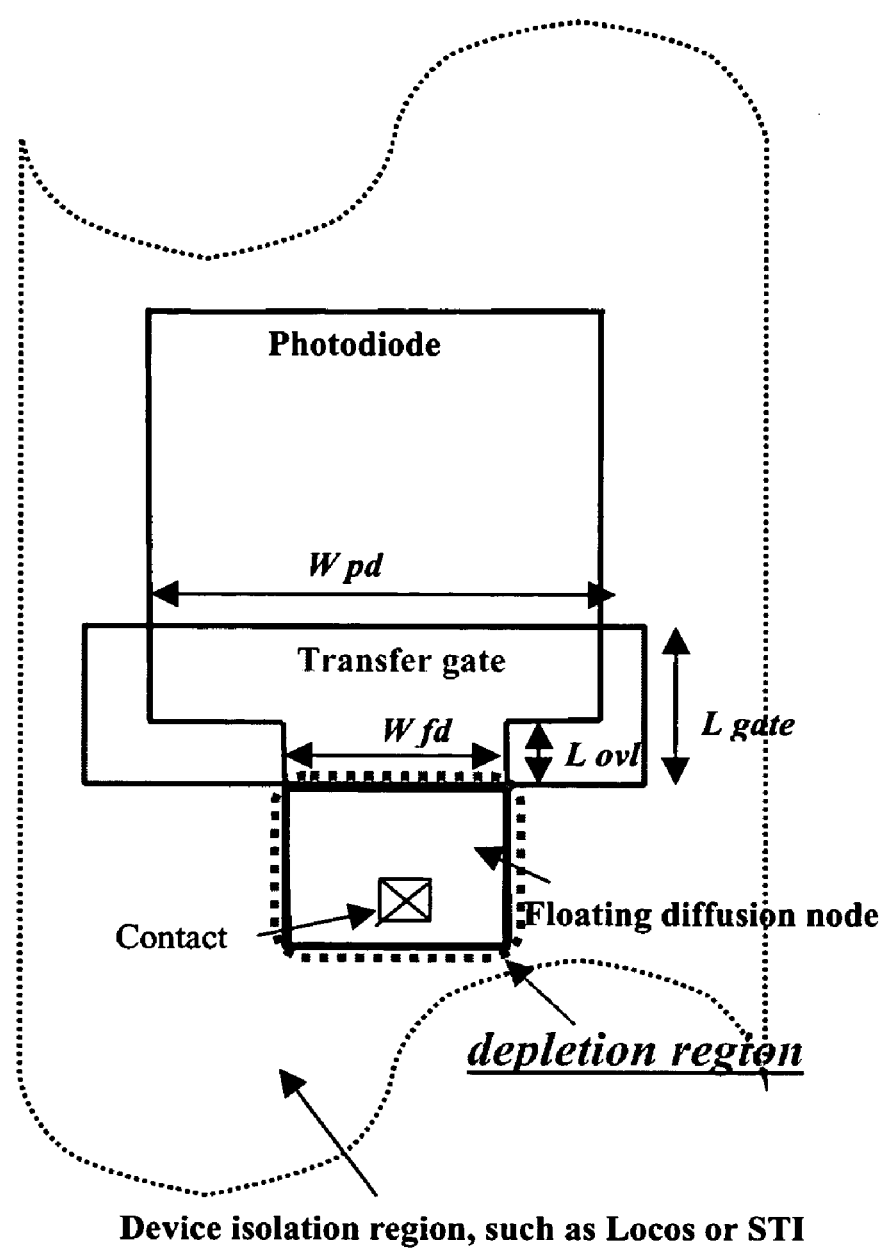
FIG. 4 is a schematic diagram of the device layout of a pixel in accordance with another embodiment of the present invention.

FIG. 4 is also a schematic diagram of the device layout of a portion of a pixel in accordance with an embodiment of the present invention. The device layout in FIG. 4 is analogous to the device layout of FIG. 3 and bears like elements. The main difference between the device layout in FIG. 3 and the device layout in FIG. 4 is the position of the floating diffusion node. However, this difference does not affect the performance of the circuit of FIG. 4.

The floating diffusion node in the present invention can be disposed in any arbitrary position. The performance of the device remains the same regardless of the position of its floating diffusion node. FIG. 3 shows an example wherein the floating diffusion node is disposed at the right or left side while FIG. 4 shows an example wherein the floating diffusion node is disposed at the center. Additionally, the floating diffusion node in the present invention is allowed to assume any shape as long as $W_{fd}$ remains less than $W_{pd}$. The present invention is also applicable to the so-called shared cell structure, wherein a floating diffusion node is shared among two or more photodiodes.

In the embodiments illustrated in FIGS. 3 and 4, since the floating diffusion node is surrounded by the device isolation region such as Locos or STI, the depletion region does not expand beyond the isolation region, specifically, in the direction of the transfer gate width. Thus, parasitic capacitance between transfer gate and floating node is effectively decreased. Furthermore, reducing $W_{fd}$ will reduce the floating node capacitance as a result of decreasing its area and, by itself, causes higher sensitivity.

Figure 5:
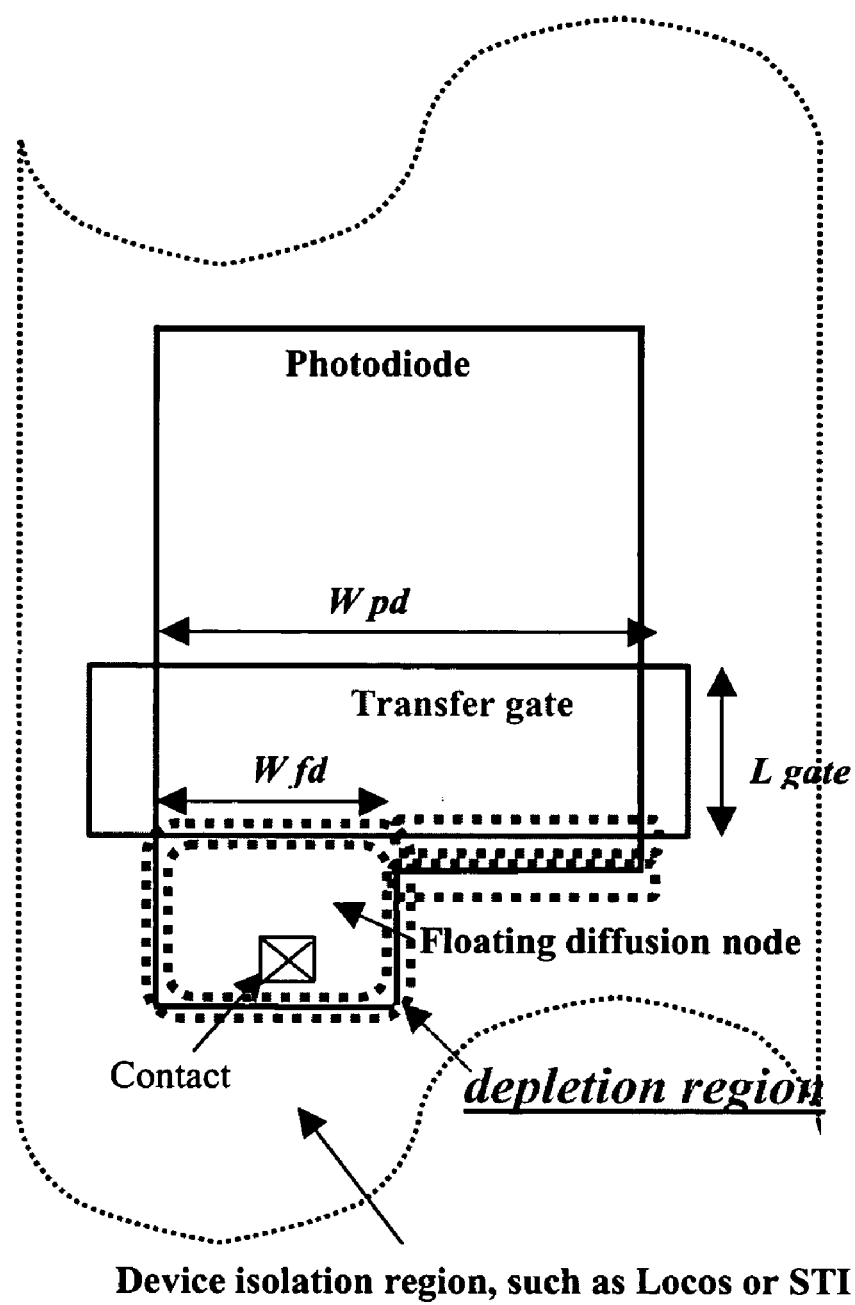
FIG. 5 is a schematic diagram of the device layout of a pixel in which there is no overlap between the device isolation region, defining the floating diffusion region, and the transfer gate in the direction of the transfer gate length.

The device isolation region, defining the floating diffusion region, must be overlapping with the transfer gate in the direction of the transfer gate length, but the overlap length $L_{ovl}$ is less than transfer gate length $L_{gate}$. If there is no overlap, as in FIG. 5, the depletion region expands all along the transfer gate and the parasitic capacitance between the transfer gate and the floating node is increased.

Figure 6A:
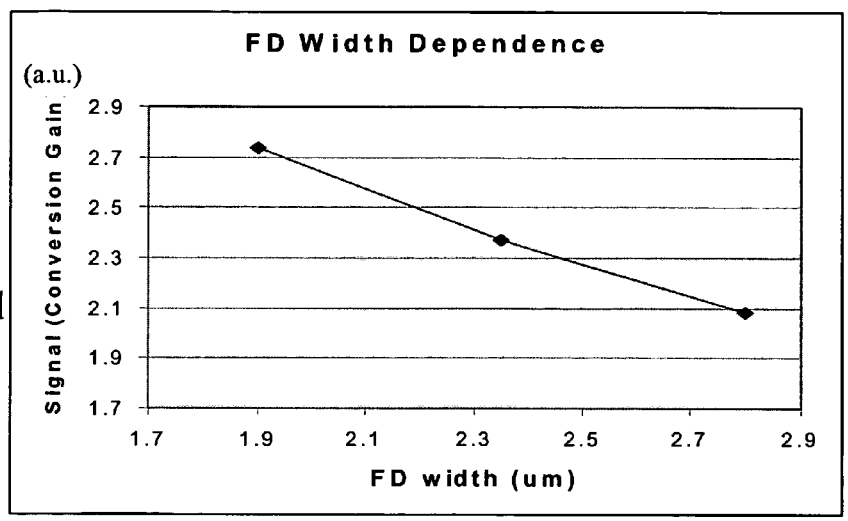
FIGS. 6A and 6B are simulation results of signal conversion gain and pixel voltage after transfer as a function of floating diffusion node width.
Figure 6B:
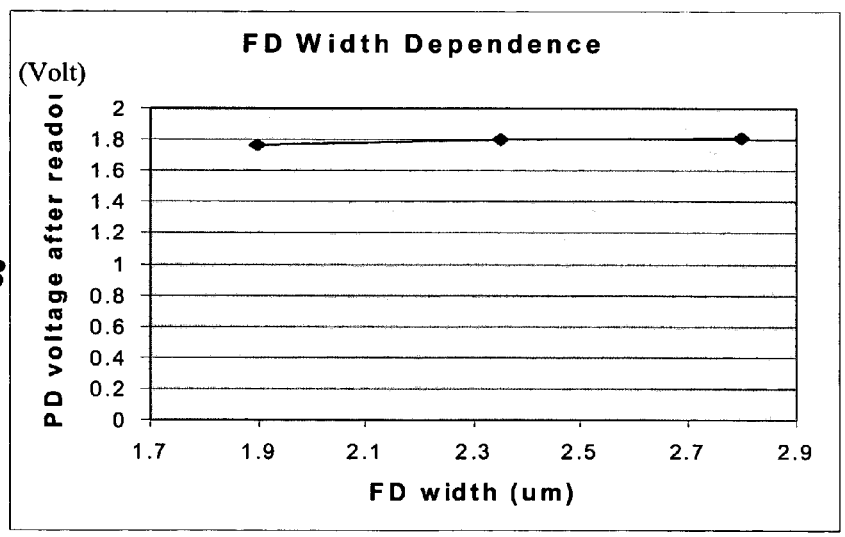

FIGS. 6A and 6B show simulation results of signal conversion gain and photodiode voltage after transfer as a function of $W_{fd}$. Signal conversion gain is the voltage change in the floating diffusion node when an electron is transferred from the photodiode into the floating diffusion node. This voltage change, multiplied by the total number of transferred electrons, corresponds to the signal voltage. The conversion gain is estimated to be inversely proportional to the capacitance of the floating diffusion node. In these simulations, the parasitic capacitances related to the connection of the source follower transistor, shown in FIG. 1, is assumed to be zero. This simulation is carried out using the structure depicted in FIG. 3.

As shown in FIG. 6A, conversion gain is almost inversly proportional to $W_{fd}$. On the other hand, the photodiode voltage after transfer stays the same despite differing values of $W_{fd}$. This means that the noise (kTC noise) and the signal saturation level are not affected by the diminishing $W_{fd}$ values. Therefore, in the present invention, high sensitivity is not obtained at the cost of other performance criteria such as a lower signal-to-noise ratio or a lower saturation level.

Figures 7A, 7B:
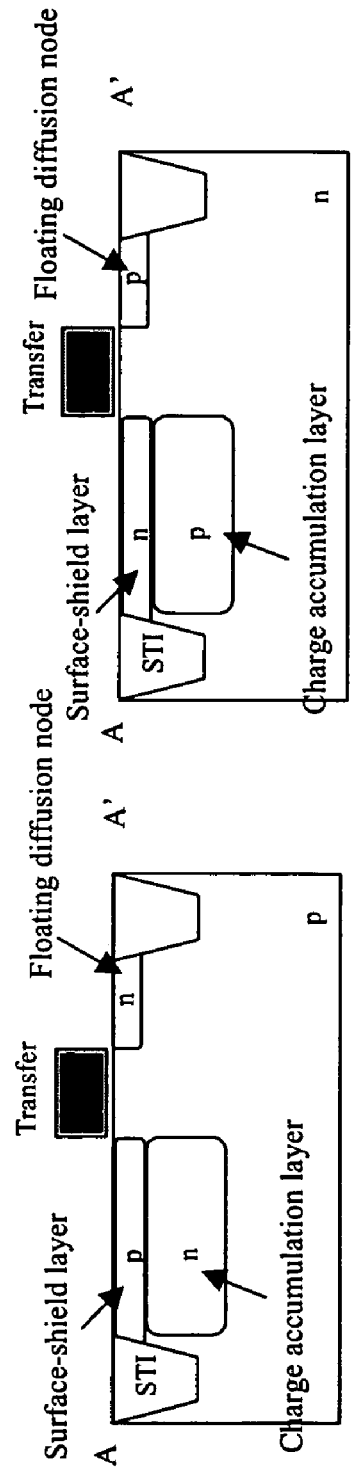
FIGS. 7A and 7B are schematic diagrams of two possible cross-sectional views of the device of FIG. 3.

FIGS. 7A and 7B are schematic diagrams of two possible A–A' cross-sectional views of the device in FIG. 3, where STI is used as the device isolation region. FIG. 7A shows a case wherein signal charges are electrons. The photodiode comprises an n-type charge accumulation layer, a p-type surface-shield layer, and a p-type substrate, forming a pinned photodiode. The well-known pinned photodiode has advantages in regard to low dark current and low noise. Of course, a typical photodiode without the surface-shield layer can be used in this invention. FIG. 7B shows a case, in accordance with an embodiment of this invention, in which the signal charges are holes.

Figure 8:
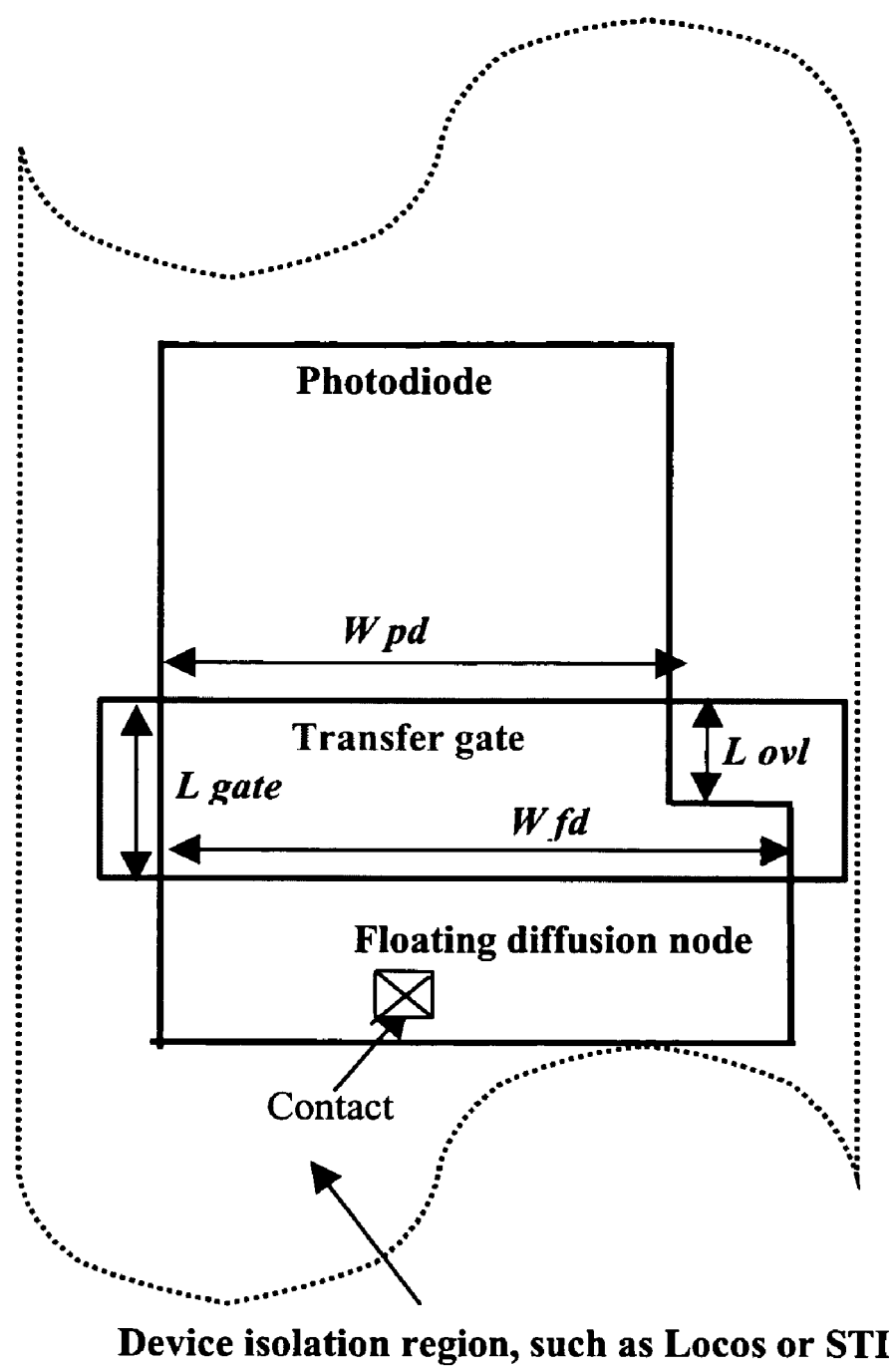
FIG. 8 is a schematic diagram of an alternative device layout of a pixel in accordance with an embodiment of the present invention.

FIG. 8 is an alternative implementation of this invention. In this case $W_{fd}$ is greater than $W_{pd}$, and $L_{ovl}$ is less than $L_{gate}$ but greater than zero. If the completely depleted potential of the photodiode is much deeper than the photodiode potential given when the charges are transferred, that is, the transfer gate voltage is high, some noise charges relating to kTC noise and image lag will also accumulate in the floating diffusion node in addition to normal signal charges. In FIG. 8, $W_{fd}$ on the side of the floating diffusion node is wider than $W_{pd}$ on the side of the photodiode. This structure makes a gradually widening current path in the direction of the charge transfer from the photodiode to the floating diffusion node. This is effective in lowering kTC noise and image lag. A more than 20% improvement in S/N (Signal-to-Noise ratio) has been verified using a test wafer, while no side effects, such as high dark current or high noise, have been found.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

For instance, while specific component values and voltage supply values are provided herein, it is to be appreciated that these values are for the sake of illustration and explanation. Various embodiments of the invention may utilize values that are different from what is specified herein.

These modifications can be made to the invention in light of the above-detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A solid-state imaging apparatus, comprising:
    a semiconductor substrate;
    a device isolation region formed on the semiconductor substrate;
    a photoelectric conversion element surrounded by the device isolation region and having a first channel width;
    a detection section surrounded by the device isolation region and having a second channel width different than the first channel width; and
    a transfer gate having a transfer gate length and positioned between the photoelectric conversion element and the detection section, wherein the transfer gate overlaps with the device isolation region to define an overlap length in the direction of the transfer gate length, the overlap length being less than the transfer gate length.

2. The solid-state imaging apparatus of claim 1, wherein the channel width of the detection section is less than the channel width of the photoelectric conversion element.

3. The solid-state imaging apparatus of claim 1, wherein the channel width of the detection section is more than the channel width of the photoelectric conversion element.

4. The solid-state imaging apparatus of claim 1, wherein the detection section has any geometric shape.

5. The solid-state imaging apparatus of claim 1, wherein the detection section is asymmetric with respect to a line passing through the length of the photoelectric section and with respect to which the photoelectric section is symmetric.

6. The solid-state imaging apparatus of claim 1, wherein the detection section is asymmetric with respect to a line passing through the length of the photoelectric section and equally dividing the photoelectric section.

7. The solid-state imaging apparatus of claim 1, wherein the transfer gate covers an area in which the channel width of the detection section is not the same as the channel width of the photoelectric section.

8. The solid-state imaging apparatus of claim 1, wherein the device isolation region is STI.

9. The solid-state imaging apparatus of claim 1, wherein the device isolation region is Locos.

10. The solid-state imaging apparatus of claim 1, wherein the photoelectric element is a photodiode.

11. A CMOS imaging sensor, comprising:
    a semiconductor substrate of a first conductivity type;
    a device isolation region formed on the semiconductor substrate defining an active area;
    a photoelectric conversion element disposed within the active area surrounded by the device isolation region;
    a detection section of a second conductivity type, disposed within the active area; and
    a transfer gate having a transfer gate length and provided within the device region for transferring a charge produced by the photoelectric conversion element to the detection section, wherein a channel width of the detection section is different from a channel width of the photoelectric conversion element, and wherein the device isolation region overlaps the transfer gate to define an overlap length in the direction of the transfer gate length, the overlap length being less than the transfer gate length.

12. The sensor of claim 11, wherein the channel width of the detection section is less than the channel width of the photoelectric conversion element.

13. The sensor of claim 11, wherein the channel width of the detection section is more than the channel width of tile photoelectric conversion element.

14. The sensor of claim 11, wherein the detection section has any geometric shape.

15. The sensor of claim 11, wherein the detection section is asymmetric with respect to a line passing through the length of the photoelectric section and with respect to which the photoelectric section is symmetric.

16. The sensor of claim 11, wherein the detection section is asymmetric with respect to a line passing through the length of the photoelectric section and equally dividing the photoelectric section.

17. The sensor of claim 11, wherein the transfer gate covers an area in which the channel width of the detection section is not the same as the channel width of the photoelectric section.

18. The sensor of claim 11, wherein the device isolation region is STI.

19. The sensor of claim 11, wherein the device isolation region is Locos.

20. The sensor of claim 11, wherein the photoelectric element is a photodiode.

21. An active pixel formed in a semiconductor substrate, comprising:
    an isolation region formed on the semiconductor substrate defining an active area;
    a photoelectric element formed in the active area;
    an output node formed in the active area;
    a transfer gate having a transfer gate length between said output node and said photoelectric element, wherein a channel width of the output node is different from a channel width of the photoelectric element, and wherein the isolation region overlaps the transfer gate to define an overlap length in the direction of the transfer gate length, the overlap length being less than the transfer gate length.

22. The active pixel of claim 21, wherein the channel width of the detection section is less than the channel width of the photoelectric conversion element.

23. The active pixel of claim 21, wherein the channel width of the detection section is more than the channel width of the photoelectric conversion element.

24. The active pixel of claim 21, wherein the detection section has any geometric shape.

25. The active pixel of claim 21, wherein the detection section is asymmetric with respect to a line passing through the length of the photoelectric section and with respect to which the photoelectric section is symmetric.

26. The active pixel of claim 21, wherein the detection section is asymmetric with respect to a line passing through the length of the photoelectric section and equally dividing the photoelectric section.

27. The active pixel of claim 21, wherein the transfer gate covers an area in which the channel width of the detection section is not the same as the channel width of the photoelectric section.

28. The active pixel of claim 21, wherein the device isolation region is STI.

29. The active pixel of claim 21, wherein the device isolation region is Locos.

30. The active pixel of claim 21, wherein the photoelectric element is a photodiode.

* * * * *

UNITED STATES PATENT AND TRADEMARK OFFICE
CERTIFICATE OF CORRECTION

| | | |
|---|---|---|
| PATENT NO. | : 7,145,122 B2 | |
| APPLICATION NO. | : 10/867020 | |
| DATED | : December 5, 2006 | |
| INVENTOR(S) | : Nozaki et al. | |

It is certified that error appears in the above-identified patent and that said Letters Patent is hereby corrected as shown below:

<u>Title Page & Col. 1 Line 1</u>

Title: "IMAGING SENSOR USING ASYMMETRIC TRANSFER TRANSISTOR" should be --ACTIVE PIXEL CELL USING ASYMMETRIC TRANSFER TRANSISTOR--;

<u>Column 6</u>

Line 29, "tile" should be --the--.

Signed and Sealed this

Third Day of April, 2007

JON W. DUDAS
*Director of the United States Patent and Trademark Office*